(12) United States Patent
Liu et al.

(10) Patent No.: US 12,550,411 B2
(45) Date of Patent: Feb. 10, 2026

(54) HIGH ELECTRON MOBILITY TRANSISTOR DEVICE AND METHOD OF MAKING THE SAME

(71) Applicant: XIAMEN SAN'AN INTEGRATED CIRCUIT CO., LTD., Fujian (CN)

(72) Inventors: Shenghou Liu, Fujian (CN); Wenbi Cai, Fujian (CN); Xiguo Sun, Fujian (CN); Hui Zhang, Fujian (CN)

(73) Assignee: XIAMEN SAN'AN INTEGRATED CIRCUIT CO., LTD., Xiamen (CN)

( * ) Notice: Subject to any disclaimer, the term of this patent is extended or adjusted under 35 U.S.C. 154(b) by 392 days.

(21) Appl. No.: 18/353,469

(22) Filed: Jul. 17, 2023

(65) Prior Publication Data

US 2023/0361186 A1 Nov. 9, 2023

Related U.S. Application Data

(63) Continuation-in-part of application No. PCT/CN2021/105294, filed on Jul. 8, 2021.

(30) Foreign Application Priority Data

Mar. 15, 2021 (CN) .......................... 202110276933.3

(51) Int. Cl.
  *H10D 30/47* (2025.01)
  *H10D 30/01* (2025.01)
  (Continued)

(52) U.S. Cl.
  CPC ......... *H10D 64/411* (2025.01); *H10D 30/015* (2025.01); *H10D 30/475* (2025.01); *H10D 62/8503* (2025.01); *H10D 64/01* (2025.01)

(58) Field of Classification Search
  CPC .. H10D 30/015; H10D 30/471; H10D 30/472; H10D 30/473; H10D 30/4732;
  (Continued)

(56) References Cited

U.S. PATENT DOCUMENTS

| | | | |
|---|---|---|---|
| 2011/0204380 A1* | 8/2011 | Yoshioka | H10D 64/511 |
| | | | 257/E29.242 |
| 2015/0372081 A1* | 12/2015 | Lee | H10D 62/8503 |
| | | | 257/76 |
| 2021/0305373 A1* | 9/2021 | Teo | H10D 62/8503 |

FOREIGN PATENT DOCUMENTS

| | | |
|---|---|---|
| CN | 106024880 A | 10/2016 |
| CN | 205900552 U | 1/2017 |
| CN | 108987277 A | 12/2018 |

OTHER PUBLICATIONS

"Threshold voltage dependence on channel width in nano-channel array AlGaN/GaN HEMTs" by Shenghou Liu et al. in Phys. Status Solidi C 9, No. 3-4, 879-882 (Year: 2012).*

(Continued)

*Primary Examiner* — Eric A. Ward
(74) *Attorney, Agent, or Firm* — MUNCY, GEISSLER, OLDS & LOWE, P.C.

(57) ABSTRACT

An HEMT device includes a substrate, a buffer layer, a channel layer, and a barrier layer sequentially disposed in such order; a source electrode and a drain electrode disposed oppositely on an active region, and a gate electrode including a comb structure disposed in a gate region between the source electrode and the drain electrode. The comb structure includes a comb stem portion and a plurality of comb tooth portions. The comb tooth portions are spaced apart from each other in a gate width direction. The comb stem portion is disposed on the barrier layer. Distances between the comb tooth portions in the gate width direction are unequal and irregular. The comb tooth portions penetrate into the barrier layer to equal depths, and the depths are no smaller than half of a thickness of the barrier layer. A method for making the HEMT device is also provided.

20 Claims, 5 Drawing Sheets

(51) Int. Cl.
*H10D 62/85* (2025.01)
*H10D 64/01* (2025.01)
*H10D 64/27* (2025.01)

(58) Field of Classification Search
CPC .......... H10D 30/4735; H10D 30/4738; H10D 30/474; H10D 30/475; H10D 30/4755; H10D 30/476; H10D 30/477
See application file for complete search history.

(56) References Cited

OTHER PUBLICATIONS

Search Report issued to PCT application No. PCT/CN2021/105294 on Dec. 14, 2021.

* cited by examiner

HIGH ELECTRON MOBILITY TRANSISTOR DEVICE AND METHOD OF MAKING THE SAME

CROSS-REFERENCE TO RELATED APPLICATION

This application is a continuation-in-part (CIP) of International Application No. PCT/CN2021/105294, filed on Jul. 8, 2021, which claims priority to Chinese Invention Patent Application No. 202110276933.3, filed on Mar. 15, 2021.

FIELD

The disclosure relates to a semiconductor device, and more particularly to a high electron mobility transistor (HEMT) device.

BACKGROUND 5G technology is the latest generation of mobile communication technology and is an extension of 4G (e.g., LTE-A, WiMax), 3G (e.g., UMTS, LTE) and 2G (e.g., GSM) technologies. 5G technology is widely used in smart home, telehealth, distance education, manufacturing, and Internet of Things (IoT), specifically in gigabyte mobile broadband data access, 3D video, HD video, cloud services, augmented reality (AR), virtual reality (VR), automation, emergency services, self-driving vehicles, logistics management, etc. Among these applications, HD video, AR, VR, telehealth, automation, and logistics management are mainly indoor applications.

Research on GaN materials and application thereof is a trending topic. GaN materials are used in making microelectronic devices and optoelectronic devices. GaN together with SiC, diamond, and other semiconductor materials is the third generation of semiconductor materials after the first generation of semiconductor materials (i.e., Ge and Si) and the second generation of compound semiconductor materials (i.e, GaAs and InP). Gallium nitride (GaN) offers a wide forbidden band width, high electrical breakdown field, high thermal conductivity, high electron saturation velocity, and a much higher radiation resistance, and may be widely applied in power semiconductor devices having high temperature, high frequency, and high microwave. A low ohmic contact resistance plays a critical role in output power, high efficiency, high frequency, and noise performance. In recent years, GaN having higher power output at high frequency and being smaller in size is widely used in radio frequency communications.

Among applications of a GaN radio frequency device, a GaN HEMT device is a transverse plane device. Referring to FIG. 1, transductance of the GaN HEMT device varies with gate-to-source voltage (Vgs). As the gate-to-source voltage increases, transductance decreases so that gain decreases correspondingly. Transductance is a ratio of a changing value of output current to a changing value of input voltage. The nonlinearity of a power amplifier leads to significant band edge leakage, premature saturation of the output power, signal distortion, etc., thereby impacting performance of the device and increasing complexity in design of the device.

SUMMARY

Therefore, an object of the disclosure is to provide a HEMT device that can alleviate at least one of the drawbacks of the prior art.

According to the disclosure, the HEMT device includes a substrate, a buffer layer, a channel layer, a barrier layer, a source electrode, a drain electrode, and a gate electrode. The substrate, the buffer layer, the channel layer, and the barrier layer are sequentially disposed in such order in a bottom-up direction and cooperatively form an active region. The source electrode and the drain electrode are disposed oppositely on the active region, and the gate electrode includes a comb structure disposed in a gate region between the source electrode and the drain electrode on the active region. The comb structure includes a comb stem portion and a plurality of comb tooth portions connected to the comb stem portion. The comb tooth portions are spaced apart from each other in a gate width direction. The comb stem portion is disposed on the barrier layer and is parallel to one of the source electrode and the drain electrode. Distances between adjacent ones of the comb tooth portions in the gate width direction are unequal and are arranged in an irregular distribution, and a density distribution of the comb tooth portions is nonuniform. The distances have two different distance values or more than two different distance values. The comb tooth portions penetrate into the barrier layer to equal depths, and the depths are no smaller than half of a thickness of the barrier layer.

According to another aspect of the disclosure, a method for manufacturing the HEMT device includes the steps of: providing a substrate; forming a buffer layer, a channel layer, and a barrier layer that is sequentially disposed on the substrate in such order in a bottom-up direction and that cooperatively form an active region; forming a source electrode and a drain electrode on the active region; and forming a gate electrode in a gate region between the source electrode and the drain electrode and on the active region. The gate electrode has a comb structure formed in the gate region and including a comb stem portion and a plurality of comb tooth portions connected to the comb stem portion. The comb tooth portions are spaced apart from each other in a gate width direction. The comb stem portion is disposed on the barrier layer and is parallel to one of the source electrode and the drain electrode. Distances between adjacent ones of the comb tooth portions in the gate width direction are unequal and are arranged in an irregular distribution, and a density distribution of the comb tooth portions is nonuniform. The distances have two different distance values or more than two different distance values. The comb tooth portions penetrate into the barrier layer to equal depths in the barrier layer, and the depths are no smaller than half of a thickness of the barrier layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
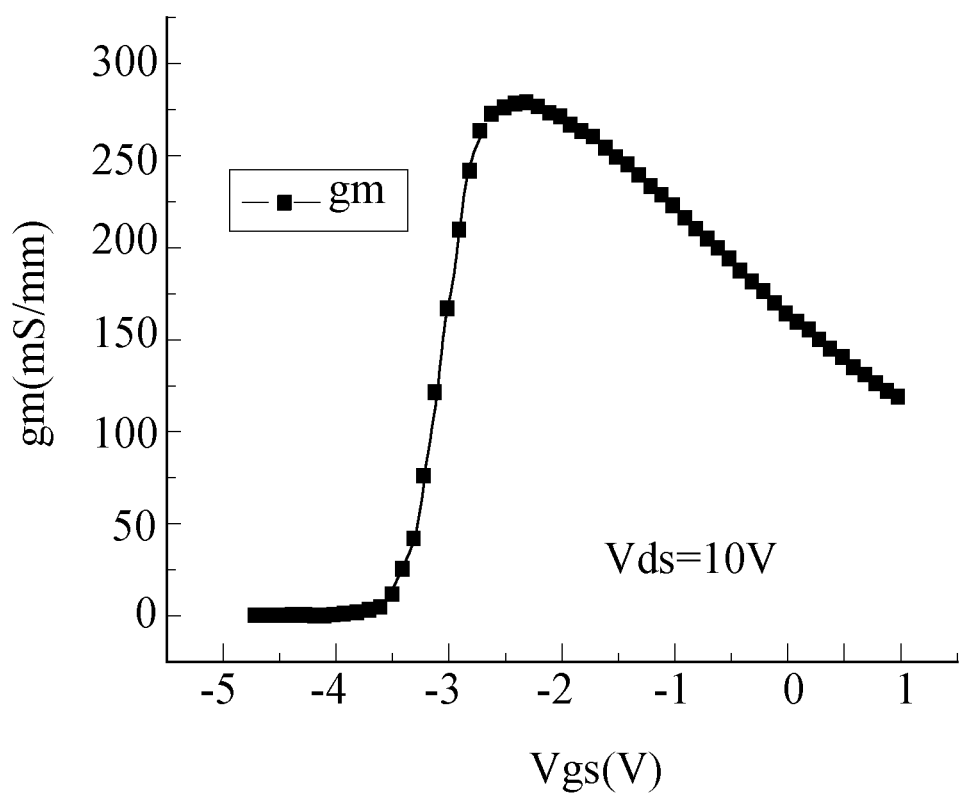
FIG. 1 is a curve graph illustrating relationship between gate-to-source voltage and transductance of a GaN HEMT device.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
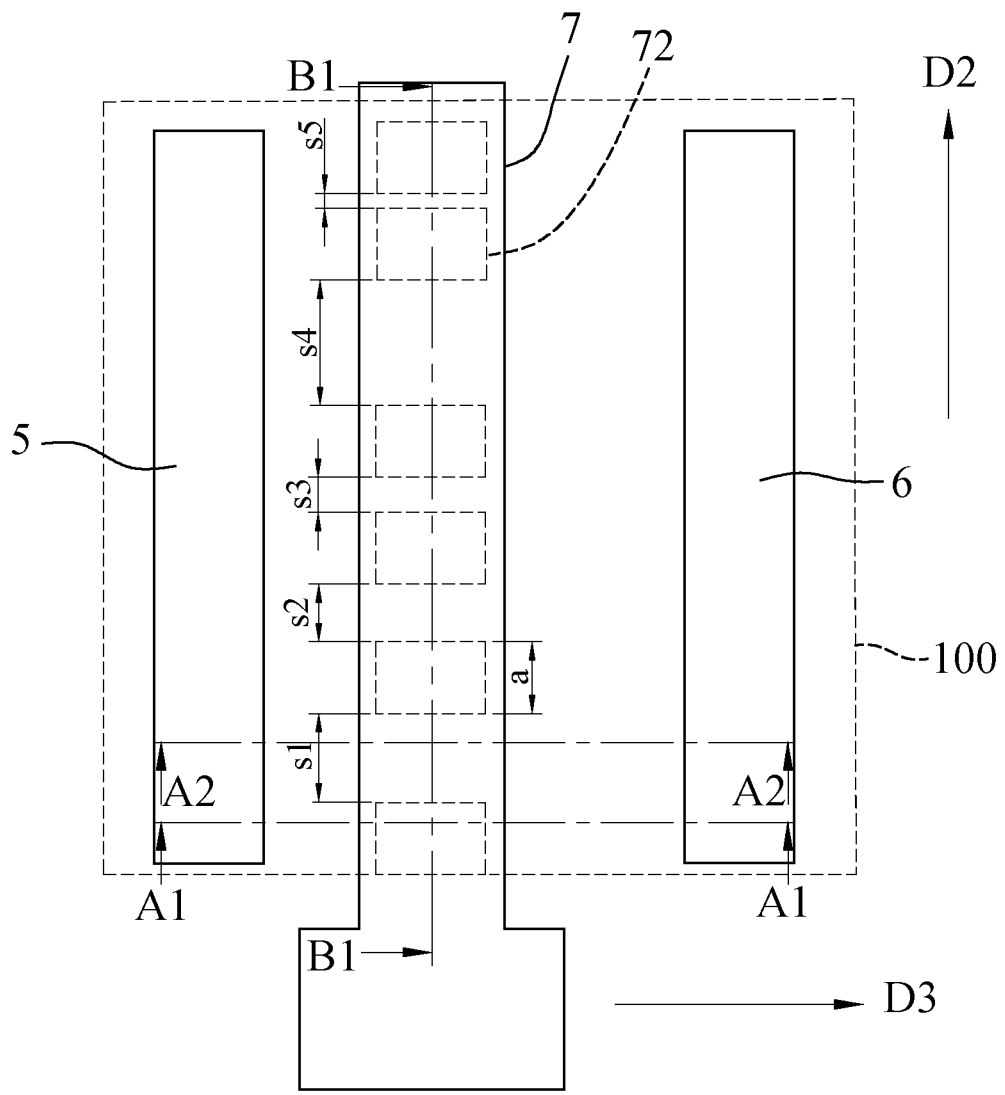
FIG. 2 is a schematic view illustrating a first embodiment of the HEMT device according to the present disclosure, wherein small rectangular dashed boxes illustrate a plurality of comb tooth portions of a gate electrode.
Figure 3:
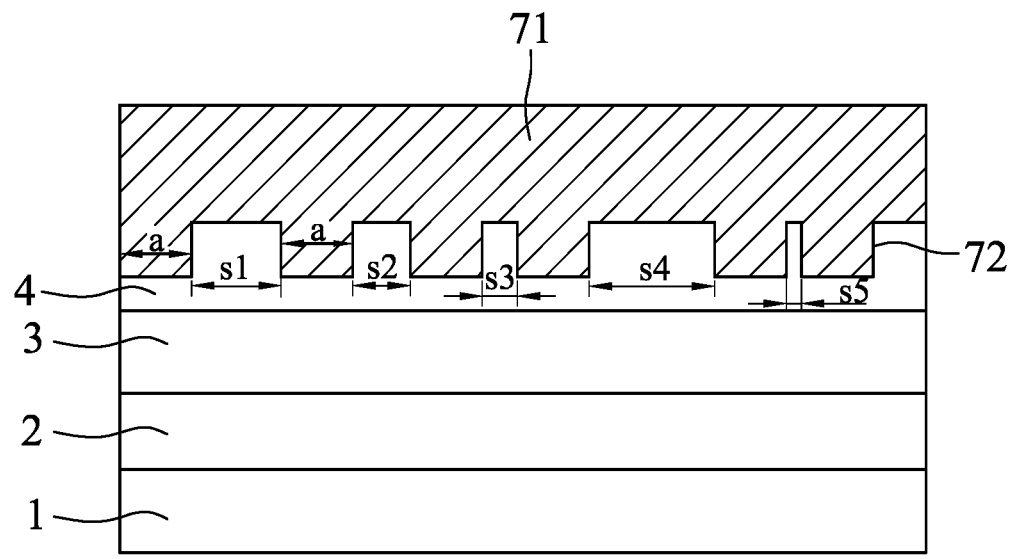
FIG. 3 is a cross-sectional schematic view along a gate width direction (D2) illustrating the first embodiment of the HEMT device according to the present disclosure.

Referring to FIGS. 2 and 3, the HEMT device of this disclosure includes a substrate 1, a buffer layer 2, a channel layer 3, and a barrier layer 4 disposed in such order in a bottom-up direction (D1). The buffer layer 2, the channel layer 3, and the barrier layer 4 are formed by epitaxial technique and cooperatively form an active region 100. The HEMT device further includes a source electrode 5 and a drain electrode 6 that are disposed oppositely on the active region 100, and a gate electrode 7 that includes a comb structure disposed on the active region and between the source electrode 5 and the drain electrode 6. The comb structure includes a comb stem portion 71 and a plurality of comb tooth portions 72 connected to the comb stem portion 71. The comb tooth portions 72 are spaced apart in a gate width direction (D2). The comb stem portion 71 is disposed on the barrier layer 4 and is parallel to one of the source electrode 5 and the drain electrode 6. Distances between adjacent ones of the comb tooth portions 72 in the gate width direction (D2) are unequal and are arranged in an irregular distribution, and a density distribution of the comb tooth portions 72 is nonuniform. The distances between adjacent comb tooth portions have two different distance values or more than two different distance values. The irregular distribution refers to a random distribution that lacks linear regularity. That is to say, one of the distances between adjacent comb tooth portions 72 is large, while the next one of the distances is small. Contrary to the irregular distribution, a regular distribution means that the distances between adjacent comb tooth portions 72 are in an order of a gradual decrease or increase, or that the distances are equal. The comb tooth portions 72 penetrate into the barrier layer 4 to equal depths, and the depths are no smaller than half of a thickness of the barrier layer 4. Referring to FIG. 3, a cross-sectional schematic view of the embodiment along the gate width direction (D2) is shown. The gate electrode 7 is symmetrically disposed in a gate length direction (D3), and each of the comb tooth portions 72 has a symmetrical shape in the gate length direction (D3). In this embodiment, the HEMT device is illustrated with six comb tooth portions. Counting from the left, the distance between the first comb tooth portion and the second comb tooth portion is s1, the distance between the second comb tooth portion and the third comb tooth portion is s2, the distance between the third comb tooth portion and the fourth comb tooth portion is s3, the distance between the fourth comb tooth portion and the fifth comb tooth portion is s4, and the distance between the fifth comb tooth portion and the sixth comb tooth portion is s5, wherein s1, s2, s3, s4, s5 are not equal to each other and s4>s1>s2>s3>s5. Each of the comb tooth portions 72 has a cross-section with a dimension (a) (see FIGS. 2 and 3) in the gate width direction (D2) ranging from 20 nm to 1000 nm.

Figure 4:
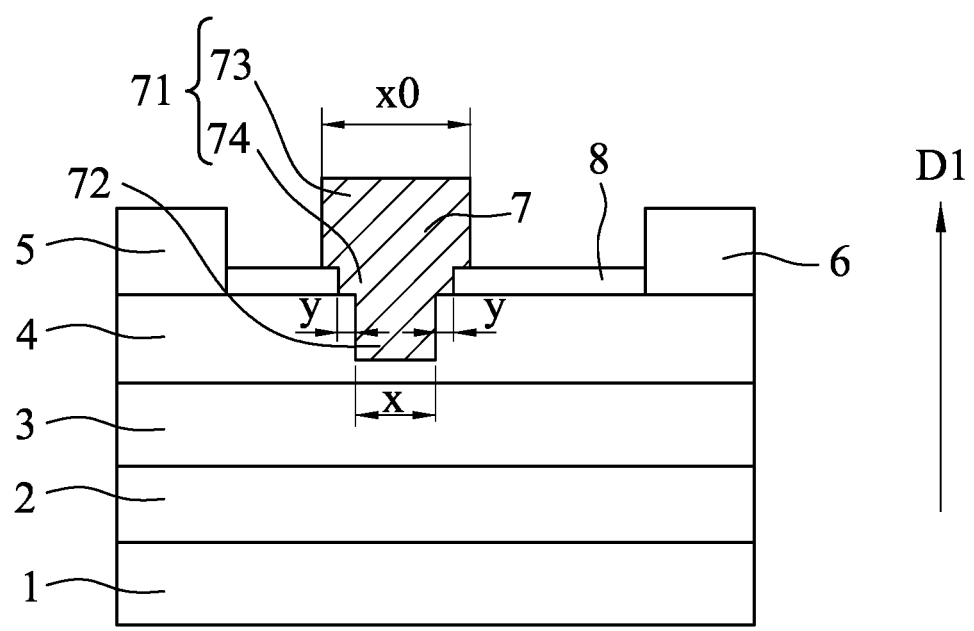
FIG. 4 is a cross-sectional schematic view along a section line (A1) in a gate length direction (D3) illustrating the first embodiment of the HEMT device according to the present disclosure.

Cross sections of the comb tooth portions 72 are rectangular (as shown in the dashed boxes 72 of the gate electrode 7 in FIG. 2). Referring to FIG. 4 in combination with FIG. 3, the gate electrode 7 is a T-shaped gate electrode. The comb stem portion 71 has a gate cap 73 connected to a comb stem foot 74 that is located on the surface of the barrier layer 4 and that directly connects each of the comb tooth portions 72. A dimension (x) of each of the comb tooth portions 72 in a gate length direction (D3) is smaller than a dimension ($x_0$) of the gate region in the gate length direction (D3), and a ratio of x:$x_0$ ranging from 0.6 to 0.9. The relationship between the dimension (x) of the comb tooth portions 72 in the gate length direction (D3) and the dimension ($x_0$) of the gate region in the gate length direction (D3) is also critical for performance of the device. If x/$x_0$ is too large, which means that the dimension (x) of each of the comb tooth portions 72 is close to the dimension ($x_0$) of the gate region in the gate length direction (D3), then the regions (y) at the left and right sides of the comb tooth portions 72 not removed and covered by the gate electrode 7 becomes smaller, thereby reducing current conductivity of the comb tooth portions 72 and lowering the current at the drain electrode of the HEMT device. If x/$x_0$ is too small, which means that the comb tooth portions 72 occupy a smaller space in the gate length direction (D3), a short channel effect is more likely to occur, thereby weakening a pinch-off voltage on the comb tooth portions 72.

It should be noted that the cross-section of each of the comb tooth portions 72 in the gate length direction (D3) has any one of a circular shape, an elliptical shape, a rectangular shape, a square shape, a racetrack shape, and a polygonal shape.

The HEMT device of the present disclosure is a gallium nitride based HEMT device having a heterojunction formed between the channel layer 3 and the barrier layer 4 so that a two-dimensional electron gas may be formed at a contact surface between the two layers. For example, the channel layer 3 may be made of a gallium nitride material, and the barrier layer 4 may be made of an aluminum gallium nitride material. In the present disclosure, the channel layer 3 and the barrier layer 4 that form the heterojunction may also be made of a GaN material and an indium gallium nitride material, respectively. There is no limit to the materials of the channel layer 3 and the barrier layer 4, as long as the heterojunction may be formed. The barrier layer 4 may be aluminum gallium nitride, aluminum nitride, aluminum indium nitride, aluminum gallium nitride, indium gallium nitride, aluminum indium gallium nitride, etc. The barrier layer 4 has a thickness that ranges from 3 nm to 50 nm.

Referring again to FIG. 4, the gate electrode 7 has tooth-situated regions where the comb tooth portions 72 are respectively situated. Each of the tooth-situated regions has a T-shaped cross-section along the gate length direction (D3), the T-shaped cross-section including the gate cap 73, the comb tooth foot portion 72 that extends into the barrier layer 4, and the comb stem foot 74 that directly connects the comb tooth portion 72. A dielectric layer 8 is disposed between the barrier layer 4 and a lateral edge of the gate cap 73.

Figure 5:
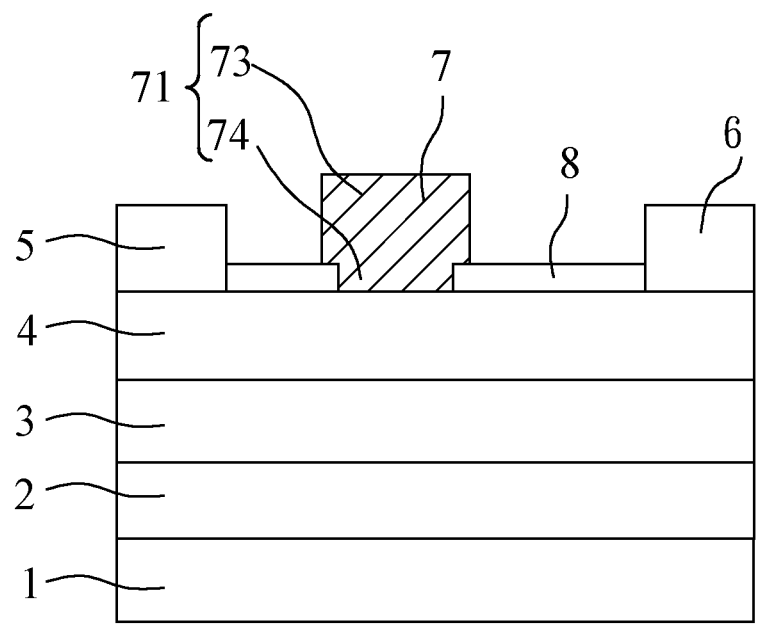
FIG. 5 is a cross-sectional schematic view along a section line (A2) in the gate length direction (D3) illustrating the first embodiment of the HEMT device according to the present disclosure.

Referring to FIG. 5, the gate electrode 7 has a tooth-free region between every two adjacent ones of the comb tooth portions 72. The tooth-free region has a T-shaped cross-section along the gate length direction (D3), and the T-shaped cross section includes the gate cap 73 and the comb stem foot 74. The comb stem foot 74 is located on the surface of the barrier layer 4 away from the channel layer 3. The dielectric layer 8 is disposed between the barrier layer 4 and a lateral edge of the gate cap 73.

The substrate 1 may be made of silicon (Si), silicon carbide (SiC), or sapphire. The buffer layer 2 may be made of GaN, and the channel layer 3 may be made of GaN. The channel layer 3 has a thickness ranging from 5 nm to 1000 nm.

In one embodiment, the substrate 1 is made of silicon and has a thickness of 100 µm, the buffer layer 2 is made of GaN, the channel layer 3 is made of GaN and has a thickness of 50 nm, and the barrier layer 4 is made of AlGaN and has a thickness of 30 nm. A nitride nucleation layer (not shown) and a nitride buffer layer are provided between the substrate 1 and the channel layer 3.

It should be noted that in the abovementioned embodiment, the source electrode 5 and the drain electrode 6 may partially penetrate into the barrier layer 4. In other embodiments, the source electrode 5 and the drain electrode 6 may be disposed on the barrier layer 4. In certain embodiments, the substrate 1 is made of sapphire and has a thickness of 60 µm, the buffer layer 2 is made of GaN, the channel layer 3 is made of GaN and has a thickness of 50 nm, and the barrier layer 4 is made of AlGaN.

A method for manufacturing a HEMT device is also provided and includes the following steps:

Step 1: Forming a buffer layer 2 made of GaN on a substrate 1 made of sapphire by metal organic chemical vapor deposition (MOCVD).

Step 2: Growing a channel layer 3 made of GaN and having a thickness of 20 nm on a surface of the GaN buffer layer 2 opposite the sapphire substrate 1.

Step 3: Growing a barrier layer 4 made of AlGaN and having a thickness of 20 nm on a surface of the GaN channel layer 3 opposite the GaN buffer layer 2.

Step 4: Forming a dielectric layer 8 made of $Si_3N_4$ and having a thickness of 100 nm on a surface of the AlGaN barrier layer 4 opposite the GaN channel layer 3 using PECVD technique under a temperature of 300 C.

Step 5: Removing partially the $Si_3N_4$ dielectric layer 8 by etching technique (i.e., reactive ion etching) to form a source region window and a drain region window respectively at a source region and a drain region.

Step 6: Forming an ohmic contact layer (e.g., made of Ti/Al/Ni/Au or Ti/Al/Mo/Au) by an electron bean evaporation process on the source region window and the drain region window, followed by high temperature annealing to produce the source electrode 5 and the drain electrode 6 on the active region 100 of the barrier layer 4.

Step 7: Forming a plurality of grooves extending in the gate width direction (D2) in a gate region between the source electrode 5 and the drain electrode 6 on the active region of the barrier layer 4 by photolithographic technique, and at least two or more of the grooves have identical depths. Referring to FIG. 2, there are six grooves. The distance between the first groove and the second groove is s1, the distance between the second groove and the third groove is s2, the distance between the third groove and the fourth groove is s3, the distance between the fourth groove and the fifth groove is s4, and the distance between the fifth groove and the sixth groove is s5, wherein s4>s1>s2>s3>s5. In this embodiment, there are more than three different distance values, specifically five different distance values.

Step 8: Forming the gate electrode 7 in the gate region and inside the grooves. The grooves are arranged irregularly in the gate width direction (D2), and distances between adjacent grooves are irregular. The distances have two different distance values or more than two different distance values. Each of the grooves has a depth no smaller than half of the thickness of the barrier layer 4.

Step 9: Forming a gate region window on the gate region by photolithographic technique and forming a Schottky contact metal (i.e., Ni or Au) on the gate region window, thereby forming the gate electrode 7. In other words, the gate electrode 7 in the gate region is formed between the source electrode 5 and the drain electrode 6 on the active region. The gate electrode 7 has the comb structure formed in the gate region and including the comb stem portion 71 and the plurality of comb tooth portions 72 connected to the comb stem portion 71. The comb tooth portions 72 are spaced apart from each other in the gate width direction (D2). The comb stem portion 71 is disposed on the barrier layer 4 and is parallel to one of the source electrode 5 and the drain electrode 6. The distances between adjacent comb tooth portions 72 in the gate width direction (D2) are irregular, and density distribution of the comb tooth portions 72 is non-uniform. The distances between adjacent comb tooth portions 72 have two different distance values or more than two different distance values. The comb tooth portions 72 penetrate into the barrier layer 4 to equal depths in the barrier layer 4, and the depths are no smaller than half of the thickness of the barrier layer 4.

The cross-section of each of the comb tooth portions 72 is rectangular. The dimension (x) of each of the comb tooth portions 72 in the gate length direction (D3) is smaller than the dimension ($x_0$) of the gate region in the gate length direction (D3), that is to say, $x<x_0$. The ratio of $x:x_0$ ranges from 0.6 to 0.9.

By virtue of semiconductor manufacturing technique, the HEMT device of the disclosure has the plurality of grooves having equal depths formed in the gate width direction (D2) and the comb structure formed between the source electrode 5 and the drain electrode 6 on the active region. The comb structure includes the comb stem portion 71 and the comb tooth portions 72 that are spaced apart from each other in the gate width direction (D2), and the distances between adjacent comb tooth portions 72 are unequal and irregular. The gate electrode 7 has one electrode segment located between one comb tooth portion (i) and the next comb tooth portion (i+1), and another electrode segment located between another comb tooth portion (j) and the next comb tooth portion (j+1) wherein i≠j. Such a comb structure of the gate electrode 7 may prevent electric current from being concentrated in a certain part of the HEMT device during on state, so that electric current is evenly distributed at the drain electrode 6. Meanwhile, electrical conduction through different electrode segments in succession at bottom of the gate electrode 7 ensure stable transconductance of the HEMT device so that as input power increases, device gain may remain constant and linearity may increase.

Figure 6:
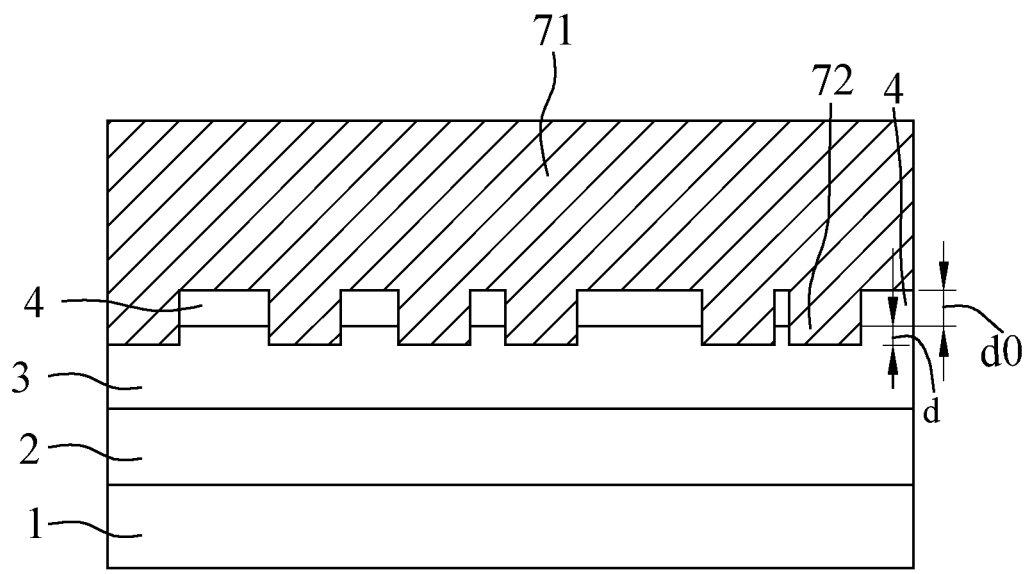
FIG. 6 is a cross-sectional schematic view along the gate width direction (D2) illustrating a second embodiment of the HEMT device according to the present disclosure.
Figure 7:
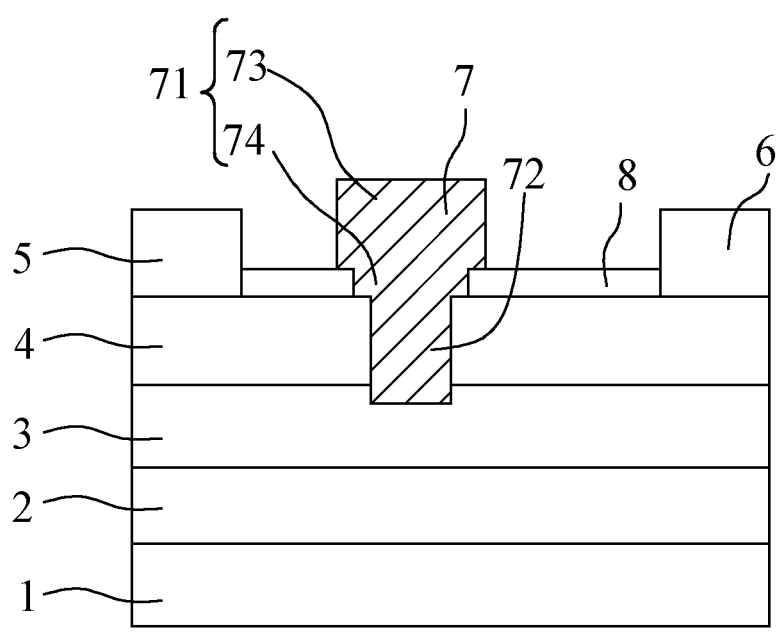
FIG. 7 is a cross-sectional schematic view along the section line (A1) in the gate length direction (D3) illustrating the second embodiment of the HEMT device according to the present disclosure.

Referring to FIGS. 6 and 7, according to another embodiment of the disclosure, the HEMT device is a nitride based HEMT device. The HEMT device of this embodiment differs from the previous embodiment in that in this embodiment, the grooves penetrate into the channel layer 3 through the barrier layer 4, a depth to which each of the grooves penetrates into the channel layer 3 ranges from 1 nm to 200 nm. The barrier layer 4 has a thickness (t0) ranging from 3 nm to 50 nm, and the channel layer 3 has a thickness (t) ranging from 5 nm to 1000 nm. Distances between adjacent comb tooth portions 72 in the gate width direction (D2) are unequal and are arranged in an irregular distribution, and a density distribution of the comb tooth portions 72 is nonuniform. The distances have two different distance values or more than two different distance values. That is to say, one of the distances between adjacent comb tooth portions 72 is large, while the next one of the distances is small. In other words, the distances between adjacent comb tooth portions 72 are not in an order of a gradual increase or decrease in the gate width direction (D2).

Correspondingly, a method of manufacturing the second embodiment of the disclosure is substantially the same as the first embodiment except for Step 7.

In Step 7, the plurality of grooves extending in the gate width direction (D2) in the gate region between the source electrode 5 and the drain electrode 6 on the active region of the barrier layer 4 is formed by photolithographic technique. The grooves penetrate into the channel layer 3 through the barrier layer 4, and the depth (d) to which each of the grooves penetrates into the channel layer 3 ranging from 1 nm to 200 nm. The grooves have depths ($d_0$+d) that range from 4 nm to 250 nm.

By virtue of semiconductor manufacturing technique, the HEMT device of the disclosure has the plurality of grooves having equal depths formed in the gate width direction (D2) and the comb structure formed between the source electrode 5 and the drain electrode 6 on the active region. The comb structure includes the comb stem portion 71 and the comb tooth portions 72 that are spaced apart from each other in the gate width direction (D2), and the distances between adjacent comb tooth portions 72 are unequal and are arranged in an irregular distribution. The gate electrode 7 has one electrode segment located between one comb tooth portion (i) and the next comb tooth portion (i+1), and another electrode segment located between another comb tooth portion (j) and the next comb tooth portion (j+1), wherein i≠j. Such a configuration of the gate electrode 7 may prevent electric current to be concentrated in a certain spot of the HEMT device during on state, so that electric current is evenly distributed at the drain electrode 6. Meanwhile, electrical conduction through different electrode segments in succession may ensure stable trans-conductance so that as input power increases, device gain may remain constant and linearity may increase.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A high electron mobility transistor (HEMT) device, comprising:

a substrate, a buffer layer, a channel layer, and a barrier layer that are sequentially disposed in such order in a bottom-up direction and that cooperatively form an active region;

a source electrode and a drain electrode disposed oppositely on said active region; and a gate electrode including a comb structure disposed in a gate region between said source electrode and said drain electrode on said active region;

wherein, said comb structure includes a comb stem portion and a plurality of comb tooth portions connected to said comb stem portion, said comb tooth portions being spaced apart from each other in a gate width direction;

said comb stem portion is disposed on said barrier layer and is parallel to one of said source electrode and said drain electrode;

distances between adjacent ones of said comb tooth portions in the gate width direction are unequal and are arranged in an irregular distribution, and a density distribution of said comb tooth portions is nonuniform, said distances having two different distance values or more than two different distance values;

said comb tooth portions penetrate into said barrier layer to equal depths;

said depths are no smaller than half of a thickness of said barrier layer.

2. The HEMT device as claimed in claim 1, wherein said comb stem portion has a comb stem foot that is located on a surface of said barrier layer and that directly connects each of said comb tooth portions, a dimension (x) of each of said comb tooth portions in a gate length direction is smaller than a dimension ($x_0$) of said gate region in the gate length direction, a ratio of $x:x_0$ ranging from 0.6 to 0.9.

3. The HEMT device as claimed in claim 1, wherein said gate electrode is symmetrically disposed in the gate length direction, each of said comb tooth portions having a symmetrical shape in the gate length direction, a cross-section of each of said comb tooth portions in the gate length direction having one of a circular shape, an elliptical shape, a rectangular shape, a square shape, a racetrack shape, and a polygonal shape.

4. The HEMT device as claimed in claim 3, wherein said gate electrode has a tooth-free region between every two adjacent ones of said comb tooth portions, said tooth-free region having a T-shaped cross section in a gate length direction and including a gate cap and a comb stem foot located on a surface of said barrier layer away from said channel layer, said gate electrode further having tooth-situated regions where said comb tooth portions are respectively situated, each of said tooth-situated regions having a T-shaped cross-section and including said gate cap and said comb tooth portion that extends into said channel layer.

5. The HEMT device as claimed in claim 1, wherein said comb tooth portions penetrate further into said channel layer through said barrier layer.

6. The HEMT device as claimed in claim 5, wherein said depth to which each of said comb tooth portions penetrates into said channel layer ranging from 1 nm to 200 nm.

7. The HEMT device as claimed in claim 1, wherein said barrier layer has a thickness ranging from 3 nm to 50 nm.

8. The HEMT device as claimed in claim 1, wherein said channel layer has a thickness ranging from 5 nm to 1000 nm.

9. The HEMT device as claimed in claim 1, wherein each of said comb tooth portions has a cross-section with a dimension in the gate width direction ranging from 20 nm to 1000 nm.

10. The HEMT device as claimed in claim 1, wherein said HEMT device is a gallium nitride based HEMT device.

11. The HEMT device as claimed in claim 1, wherein said gate electrode has a tooth-free region between every two adjacent ones of said comb tooth portions, said tooth-free region having a T-shaped cross-section along a gate length direction, and including a gate cap and a comb stem foot, said comb stem foot being located on a surface of said barrier layer away from said channel layer.

12. The HEMT device as claimed in claim 1, said gate electrode has tooth-situated regions where said comb tooth portions are respectively situated, each of said tooth-situated regions having a T-shaped cross-section along a gate length direction and including a gate cap and said comb tooth portion that extends into said barrier layer.

13. A method for manufacturing a high electron mobility transistor (HEMT) device, including steps of:
providing a substrate;
forming a buffer layer, a channel layer, and a barrier layer that are sequentially disposed on the substrate in such order in a bottom-up direction and that cooperatively form an active region;
forming a source electrode and a drain electrode on the active region;
forming a gate electrode in a gate region between the source electrode and the drain electrode on the active region;
wherein,
the gate electrode has a comb structure formed in the gate region and including a comb stem portion and a plurality of comb tooth portions connected to the comb stem portion, the comb tooth portions being spaced apart from each other in a gate width direction;
the comb stem portion is disposed on the barrier layer and is parallel to one of the source electrode and the drain electrode; distances between adjacent ones of the comb tooth portions in the gate width direction are unequal and are arranged in an irregular distribution, and a density distribution of the comb tooth portions is non-uniform, the distances having two different distance values or more than two different distance values;
the comb tooth portions penetrate into the barrier layer to equal depths in the barrier layer;
the depths are no smaller than half of a thickness of the barrier layer.

14. The method for manufacturing the HEMT device as claimed in claim 13, wherein forming the source electrode and the drain electrode includes:
depositing a dielectric layer on the barrier layer;
removing partially the dielectric layer by etching technique to form a source region window and a drain region window respectively at a source region and a drain region;
forming an ohmic contact layer on the source region window and the drain region window, followed by high temperature annealing to produce the source electrode and the drain electrode.

15. The method for manufacturing the HEMT device as claimed in claim 13, the gate electrode is formed by steps:
forming a plurality of grooves extending in a gate width direction in the gate region between the source electrode and the drain electrode on the active region of the barrier layer by photolithographic technique, at least two or more of the grooves having identical depths;
forming the gate electrode in the gate region and inside the grooves, the grooves being arranged irregularly in the gate width direction, distances between adjacent ones of the grooves being unequal and irregular, the distances having two different distance values or more than two different distance values, each of the grooves having a depth no smaller than half of the thickness of the barrier layer; and
forming a gate region window on the gate region by photolithographic technique and forming a Schottky contact metal on the gate region window, thereby forming the gate electrode.

16. The method for manufacturing the HEMT device as claimed in claim 13, wherein the comb stem portion has a comb stem foot that is located on a surface of the barrier layer and that directly connects each of the comb tooth portions, and a dimension (x) of each of the comb tooth portions in a gate length direction is smaller than a dimension ($x_0$) of the gate region in the gate length direction, a ratio of $x:x_0$ ranging from 0.6 to 0.9.

17. The method for manufacturing the HEMT device as claimed in claim 15, wherein the grooves penetrate into the channel layer through the barrier layer, a depth to which each of the grooves penetrates into the channel layer ranging from 1 nm to 200 nm.

18. The method for manufacturing the HEMT device as claimed in claim 13, wherein the barrier layer has a thickness ranging from 3 nm to 50 nm, the channel layer having a thickness ranging from 5 nm to 1000 nm.

19. The method for manufacturing the HEMT device as claimed in claim 13, wherein the gate electrode is symmetrically disposed in the gate length direction, the comb tooth portions having a symmetrical shape in the gate length direction, a cross-section of each of the comb tooth portions in the gate length direction having one of a circular shape, an elliptical shape, a rectangular shape, a square shape, a racetrack shape, and a polygonal shape.

20. The method for manufacturing the HEMT device as claimed in claim 13, wherein each of the comb tooth portions having a cross-section with a dimension in the gate width direction ranging from 20 nm to 1000 nm.

* * * * *